(12) United States Patent
Karhade

(10) Patent No.: US 10,109,616 B2
(45) Date of Patent: Oct. 23, 2018

(54) HIGH BANDWIDTH, LOW PROFILE MULTI-DIE PACKAGE

(71) Applicant: Intel Corporation, Santa Clara, CA (US)

(72) Inventor: Omkar G. Karhade, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/388,606

(22) Filed: Dec. 22, 2016

(65) Prior Publication Data

US 2018/0182744 A1 Jun. 28, 2018

(51) Int. Cl.
| | |
|---|---|
| *H01L 23/34* | (2006.01) |
| *H01L 25/10* | (2006.01) |
| *H01L 23/31* | (2006.01) |
| *H01L 23/538* | (2006.01) |
| *H01L 23/473* | (2006.01) |
| *H01L 23/367* | (2006.01) |
| *H01L 25/00* | (2006.01) |
| *H01L 21/56* | (2006.01) |

(52) U.S. Cl.
CPC .......... *H01L 25/105* (2013.01); *H01L 21/563* (2013.01); *H01L 21/565* (2013.01); *H01L 23/3121* (2013.01); *H01L 23/3675* (2013.01); *H01L 23/473* (2013.01); *H01L 23/5384* (2013.01); *H01L 25/50* (2013.01); *H01L 2225/1052* (2013.01); *H01L 2225/1058* (2013.01); *H01L 2225/1094* (2013.01)

(58) Field of Classification Search
CPC . H01L 21/563; H01L 21/565; H01L 23/3121; H01L 23/36; H01L 23/3675; H01L 23/473; H01L 23/481; H01L 23/5384; H01L 25/0652; H01L 25/105; H01L 25/18; H01L 25/50
USPC .................................................. 257/713, 774
See application file for complete search history.

(56) References Cited

U.S. PATENT DOCUMENTS

| | | | |
|---|---|---|---|
| 2012/0106117 A1* | 5/2012 | Sundaram | ......... H01L 23/49827 361/808 |
| 2014/0110832 A1 | 4/2014 | Crisp et al. | |
| 2014/0264836 A1 | 9/2014 | Chun et al. | |
| 2015/0115464 A1* | 4/2015 | Yu | ......................... H01L 21/486 257/774 |
| 2015/0243572 A1 | 8/2015 | Albers et al. | |

(Continued)

OTHER PUBLICATIONS

Williams, Chris, "Intel teases geeks with 2017 AI hper-chip: Xeon Phi Knights Mill," http://www.theregister.co.uk/2016/08/17/intel_xeon_phi_knights_mill/, Aug. 17, 2016, 4 pages.

(Continued)

*Primary Examiner* — Brook Kebede
(74) *Attorney, Agent, or Firm* — Trop, Pruner & Hu, P.C.

(57) ABSTRACT

An embodiment includes an apparatus comprising: a substrate; a first die including a processor core; a second die not including a processor core; and a third die including memory cells; wherein: (a)(i) the first die has a smaller minimum pitch than the second die; (a)(ii) a first vertical axis intersects the substrate and the first and second dies but not the third die; and (a)(iii) a second vertical axis intersects the substrate and the second and third dies but not the first die. Other embodiments are described herein.

23 Claims, 5 Drawing Sheets

(56) References Cited

U.S. PATENT DOCUMENTS

| | | |
|---|---|---|
| 2015/0282299 A1 | 10/2015 | Shi et al. |
| 2016/0093598 A1* | 3/2016 | Jo .................... H01L 25/18 257/713 |
| 2016/0172261 A1 | 6/2016 | Hsu et al. |

OTHER PUBLICATIONS

Wikipedia, "Uncore," https://en.wikipedia.org/wiki/Uncore, Dec. 21, 2016, 2 pages.

Wikipedia, "Conformal Coating," https://en.wikipedia.org/wiki/Conformal_coating, Dec. 21, 2016, 9 pages.

Wikipedia, "Package on Package," https://en.wikipedia.org/wiki/Package_on_package, Dec. 21, 2016, 3 pages.

Wikipedia, "Printed Circuit Board," https://en.wikipedia.org/wiki/Printed_circuit_board#Assembly, Dec. 21, 2016, 10 pages.

Amkor Technology, "Package on Package (PoP; PSfvBGA; PSfcCSP; TMV(R) PoP)," http://www.amkor.com/go/Package-on-Package, Dec. 21, 2016, 5 pages.

Wikipedia, "Ball Grid Array," https://en.wikipedia.org/wiki/Ball_grid_array, Dec. 21, 2016, 6 pages.

Wikipedia, "22 Nanometer," https://en.wikipedia.org/wiki/22_nanometer, Dec. 21, 2016, 2 pages.

Wikipedia, "Flip Chip," https://en.wikipedia.org/wiki/Flip_chip, Dec. 21, 2016, 4 pages.

Wikipedia, "Floating-Point Unit," https://en.wikipedia.org/wiki/Floating-point_unit, Dec. 21, 2016, 3 pages.

Wikipedia, "Arithmetic Logic Unit," https://en.wikipedia.org/wiki/Arithmetic_logic_unit, Dec. 21, 2016, 7 pages.

Wikipedia, "Heat Pipe," https://en.wikipedia.org/wiki/Heat_pipe, Dec. 21, 2016, 16 pages.

Wikipedia, "Through-Silicon Via," https://en.wikipedia.org/wiki/Through-silicon_via, Dec. 21, 2016, 3 pages.

The International Searching Authority, Notification of Transmittal of the International Search Report and the Written Opinion of the International Searching Authority dated Mar. 2, 2018 in International Application No. PCT/US2017/061652.

* cited by examiner

HIGH BANDWIDTH, LOW PROFILE MULTI-DIE PACKAGE

BACKGROUND

As noted in U.S. Pat. No. 7,170,188, assigned to Intel Corp. of Santa Clara, Calif., USA, integrated circuits (IC) are typically housed within a package that is mounted to a printed circuit board (PCB). The package has conductive leads or pins that are soldered to the PCB and further coupled to the IC. One kind of package commonly referred to as a ball grid array (BGA) is an IC package which has a plurality of solder balls that interconnect the package to a PCB.

A package on package (PoP) is an integrated circuit packaging method to combine vertically discrete logic and memory BGA packages. Two or more packages are installed atop each other (i.e., stacked) with a standard interface to route signals between them. This allows higher component density in devices, such as mobile phones and the like.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

The above described packaging is under pressure to provide packages that are smaller, have faster communications between dies in the package, and have improved cooling of the dies included within the packages.

Figure 1:
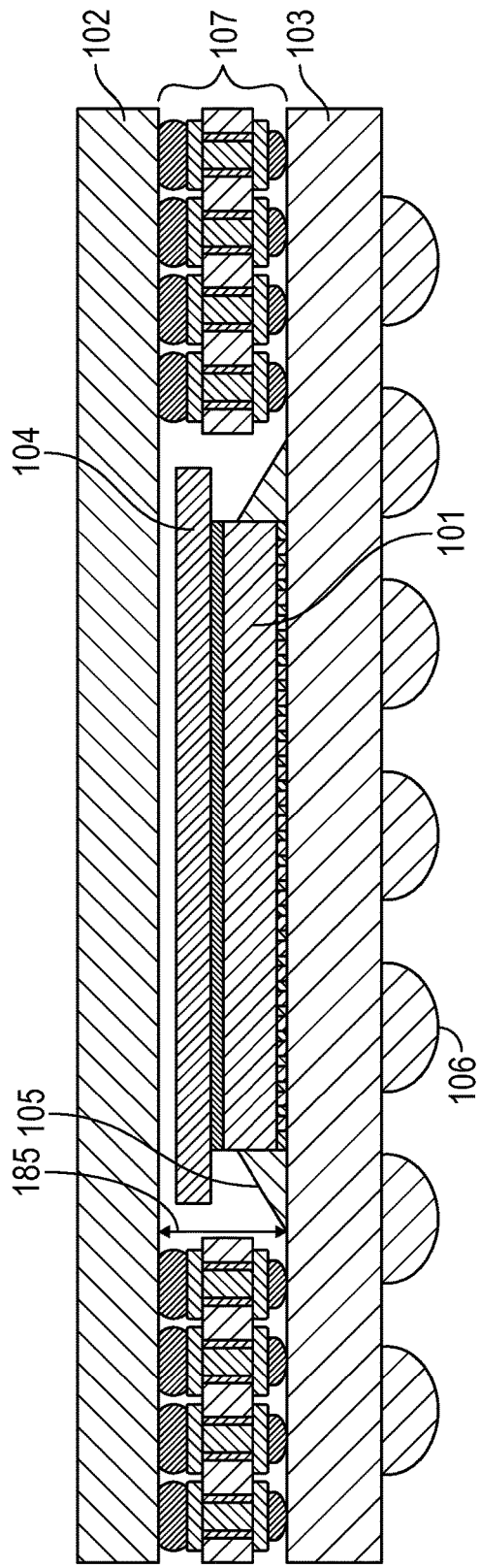
FIG. 1 includes a conventional multi-chip package.

FIG. 1 includes a conventional package system. The system includes a processor die 101 (a first package) on a substrate 103. A memory die (a second package) 102 couples to the substrate 103 by way of interposer system 107. Underfill material 105 exists between die 101 and substrate 103. Substrate 103 may include controlled collapse chip connection (C4) interconnects 106. Further, to prevent warping of die 101, die 101 may couple to a metal stiffener 104. Die 101 may include a die stack (e.g., multiple dies which may have the same function or differing functions) that may be molded as one unit that functions as a single die. For example, one die of the stack may have a first logic function while another die of the stack has another logic function that differs from the first logic function.

A flip chip, also known as C4, is a method for interconnecting semiconductor devices to external circuitry with solder bumps that have been deposited onto the chip pads. The solder bumps are deposited on the chip pads on the top side of the wafer during the final wafer processing step. In order to mount the chip to external circuitry it is flipped over so that its top side faces down, and aligned so that its pads align with matching pads on the external circuit, and then the solder is reflowed to complete the interconnect. This is in contrast to wire bonding, in which the chip is mounted upright and wires are used to interconnect the chip pads to external circuitry.

Applicant has determined the system of FIG. 1 faces various obstacles to the effort to minimize packages, improve inter-die communications, and provide improved cooling of the dies in the packages. For instance, because die 102 is above die 101, there is limited space for stiffener 104. Further, there is limited space for a cooling mechanism/thermal solution to be located on die 101. For instance, there is limited space between dies 101, 102 for a heat sink or heat tube/pipe. Further, the communication between dies 101, 102 must travel through relatively low pitch interconnects located in interposer 107.

However, an embodiment addresses many of these shortcomings. Such an embodiment achieves reduction in size by reducing the minimum pitch on dies included within the packages.

Pitch includes the center-to-center distance between features of an integrated circuit, such as interconnect lines. Pitch helps define a "node". For example, a 22 nanometer (22 nm) node is the process step following the 32 nm in CMOS semiconductor device fabrication.

Applicant has determined a package may include various die which respectively have varying minimum pitches. For example, an embodiment provides using smaller node processing (e.g., 14 nm) to manufacture a die that includes a processor core ("core die") and larger node processing (e.g., 22 nm, 32 nm, or more) to produce a die that is complimentary to the processor core, but does not itself include the processor core. This "uncore die" may not benefit as much from a smaller pitch as the processor core. Further, yield may sometimes decrease with smaller nodes so using a larger node for the uncore can improve yield and lower manufacturing costs.

For example, an uncore or "system agent" die provides functions of a microprocessor that are not in the core, but which provide high performance when closely connected to the core. The core may include components of the processor involved in executing instructions, including the arithmetic logic unit (ALU), a floating-point unit (FPU) or "math coprocessor", and level 1 (L1) or level 2 (L2) cache. An ALU is a combinational digital electronic circuit that performs arithmetic and bitwise operations on integer binary numbers. This is in contrast to a FPU, which operates on floating point numbers. An ALU is a fundamental building block of many types of computing circuits, including the central processing unit (CPU) of computers, FPUs, and graphics processing units (GPUs). A single CPU, FPU or GPU may contain multiple ALUs. Uncore functions may include QuickPath Interconnect (QPI) controllers, L3 cache, an on-die memory controller, and the like. Locating the uncore near the core die reduces access latency. Thus, an embodiment including these separate core and uncore dies offers significant benefits for the yield of the latest technology node by building only cores on that technology node (limiting the die size and hence increasing the yield) and others parts of the processor (un-core) on older technology nodes.

As will be further explained below, FIG. 2 includes an embodiment that achieves high bandwidth, decreased "Z" height (package thickness), low warpage for the package, and adequate cooling for the die or dies included in the package. Specifically, FIG. 2 provides a system whereby the uncore die functions as a high bandwidth bridge between a core die or dies and a memory die or dies.

Figure 2:
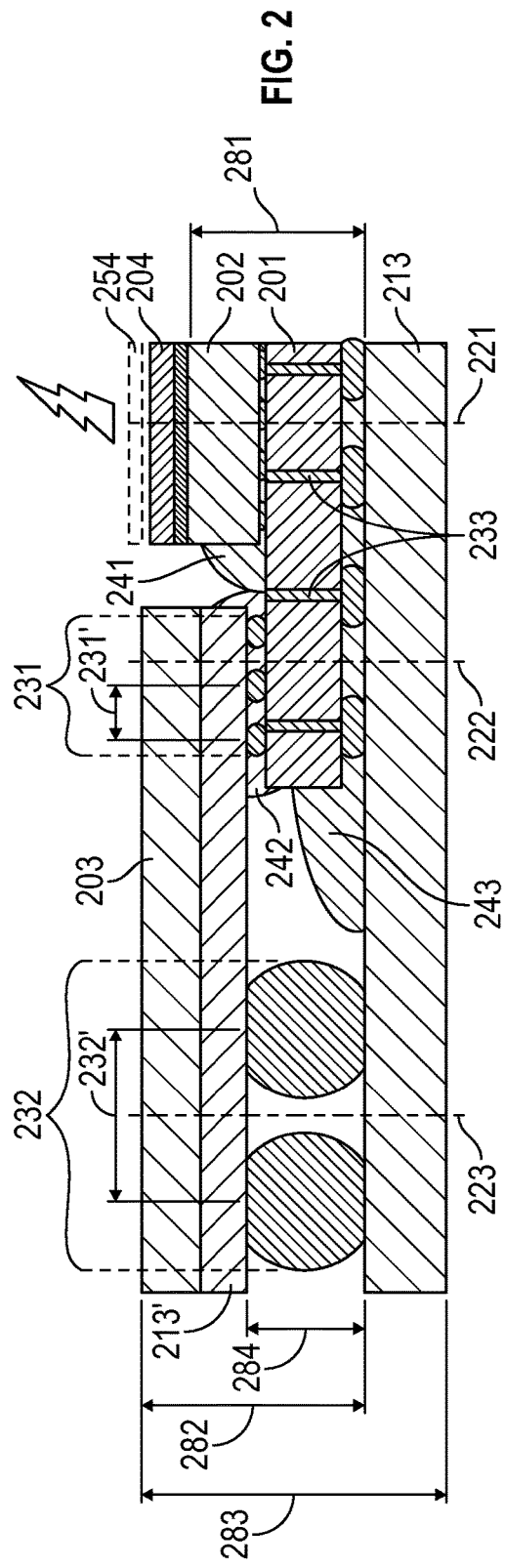
FIG. 2 includes a multi-chip system in an embodiment.

FIG. 2 provides a system 200 that comprises a substrate 213 and a die 202 including at least one of an ALU, a FPU, and a cache (e.g., L1 and/or L2 cache). The system includes a die 201 including a memory controller and a die 203 including memory cells. In the system the die 202 has a minimum pitch less than the minimum pitch of the die 201. For example, die 202 may be a core die (e.g., created using a 14 nm node or less) and die 201 may be an uncore die (e.g., created using 22 nm node or higher). A first vertical axis 221 intersects the substrate 213 and the dies 201, 202 but not the die 203. A second vertical axis 222 intersects the substrate 213 and the dies 201, 203 but not the die 202. A third vertical axis 223 intersects the die 203 but not the dies 201, 202.

While die 202 is depicted as a single die in FIG. 2, in other embodiments die 202 (and/or die 201 and/or die 203) includes a die stack with multiple dies (e.g., cores, core dies, uncore dies, and/or other types of dies). The entire die stack may be molded so the die stack behaves as one single die.

System 200 includes first interconnects 231 and second interconnects 232. In an embodiment interconnects 231 and/or 232 comprise a BGA. The first interconnects 231 couple the die 201 to the die 203 and the second interconnects 232 couple the die 203 to the substrate 213. The first interconnects 231 include a first minimum interconnect pitch that is less than a second minimum interconnect pitch of the second interconnects 232. By minimizing the interconnect pitch 231' the relatively larger pitch 232' is reserved for power and ground from memory die 203 while more signal interconnects are provided with interconnects 231 to increase bandwidth of communications between memory and core dies 203, 201. The first and second interconnects 231, 232 may include C4 interconnects, wire interconnects, and the like.

To provide increased mechanical stability, underfill material 241 may be between the dies 201, 202; and additional underfill material 242 may be between the dies 201, 203. Still additional underfill material 243 may be located between die 201 and substrate 213. Material portions 241, 242, 243 may each include the same type of material or may include differing types of material. Examples of underfill material include epoxy flux and capillary underfill material. Epoxy flux is dispensed or added before soldering the die whereas capillary underfill is dispensed after soldering the die. However, as used herein both epoxy flux and capillary underfill material and similar materials constitute underfill materials.

The system of FIG. 2 may include an additional substrate 213' located between the die 203 and the second interconnects 232. The additional substrate 213' may include the same or different materials (e.g., resin) as substrate 213.

The system may include a metal stiffener 204 on the die 202. In addition to or in place of the stiffener, system 200 may include a thermal solution 254, such as a heat sink and/or a heat pipe on the die 202. A heat pipe is a heat-transfer device that combines the principles of both thermal conductivity and phase transition to efficiently manage the transfer of heat between two solid interfaces. The thermal solution 254 may be on stiffener 204.

Die 201 may include through silicon vias (TSV) 233 to provide interconnectivity between memory 203 and/or uncore die 201 and substrate 213. By providing the die 201 between the die 202 and the substrate 213 TSVs may be avoided in core die 202, where real estate is more valuable than on die 201. However, in some embodiments the locations of dies 201, 202 may be reversed from that illustrated in FIG. 2.

A TSV is a vertical electrical connection (via) passing completely through a silicon wafer or die. TSVs are a high performance interconnect technique used to make electrical connection between two layers separated by bulk silicon. This can be more effective than using wire-bond and side by side flip-chip connections because the density of the vias is substantially higher that interconnect bumps or wires and because the length of the connections is shorter. While the term TSV is used for some embodiments, another way to describe a TSV is a via interconnect that extends from an upper surface of a substrate to a lower surface of the substrate.

In an embodiment, the die 203 extends further above the substrate 213 than the die 202 (see "z" heights 281 vs. 282). This may be due to the compact nature of a core die. Further, this "z" height may be measured from the substrate to any one of several die. For example, even though FIG. 2 displays a single memory die 203 in other embodiments there may be a stack of memory dies, any one of which may have a z height greater than that of core die 202. In fact, in other embodiments there may be a stack of core dies, uncore dies, or core dies and uncore dies, all of which cumulatively have a z height less than a z height of one or more memory die.

In an embodiment, first package molding may be molded onto and conformal with the die 202 and second package molding may be molded onto and conformal with the third die 203. The packaging around the first and third die may be continuous and monolithic overmolding but in other embodiments the packaging for the dies 202, 203 may be separate from one another. In some embodiments the packaging on the die 202 leaves space on die 202 for a heat sink or other such cooling mechanism.

Figure 3:
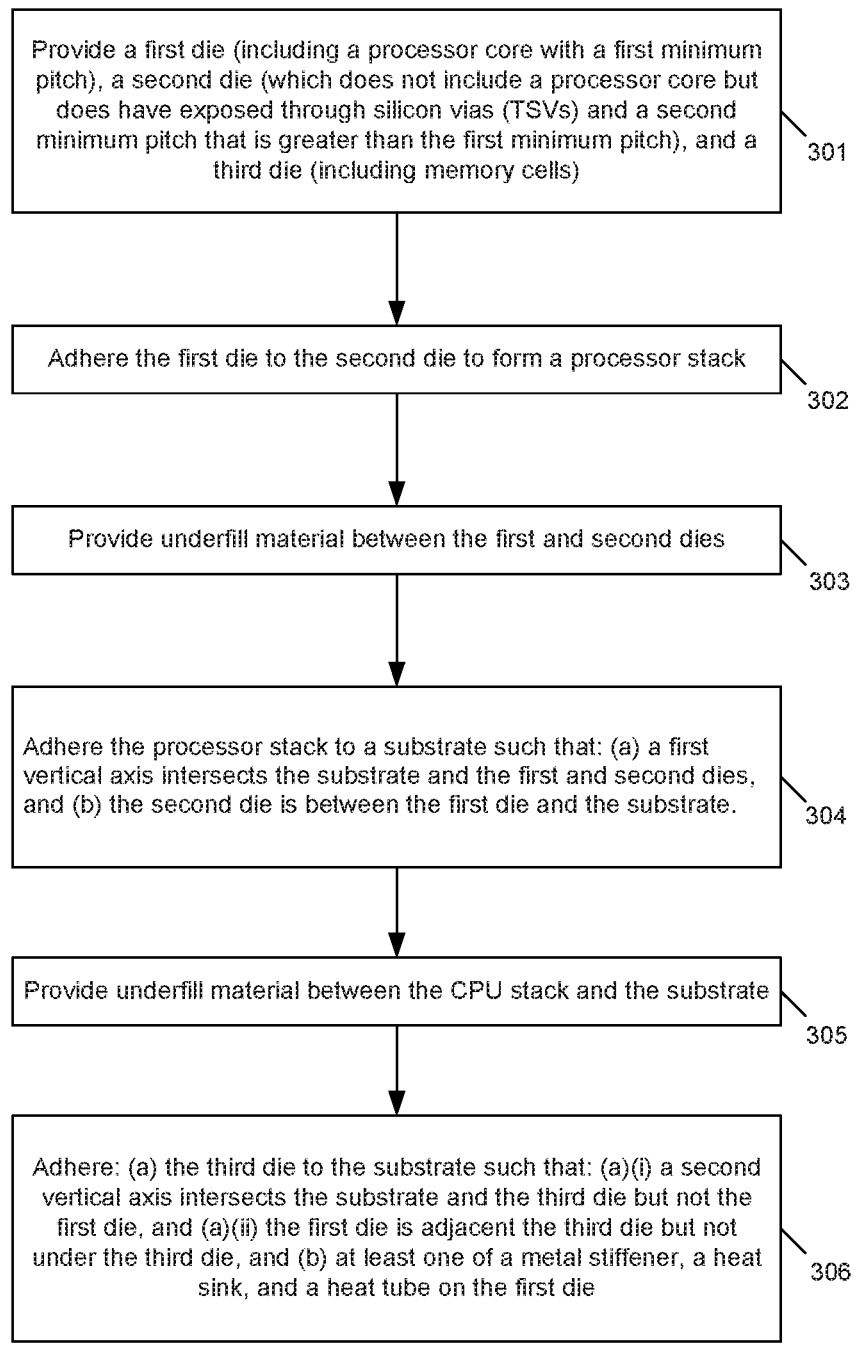
FIG. 3 depicts a process in an embodiment.

FIG. 3 includes a process 300.

Block 301 includes providing a first die (including a processor core with a first minimum pitch), a second die (which does not include a processor core but does have exposed TSVs and a second minimum pitch that is greater than the first minimum pitch), and a third die (including memory cells). This may involve thinning the die to expose the TSVs.

Block 302 includes adhering the first die to the second die to form a processor stack.

Block 303 includes providing underfill material between the first and second dies. At this point or at some other point in process 300 the core and uncore dies may be singulated from a larger substrate.

Block 304 includes adhering the processor stack to a substrate such that: (a) a first vertical axis intersects the substrate and the first and second dies, and (b) the second die is between the first die and the substrate. This may involve mass reflow or thermal compression bonding to the substrate system.

Block 305 includes providing underfill material between the CPU stack and the substrate.

Block 306 includes adhering: (a) the third die to the substrate such that: (a)(i) a second vertical axis intersects the substrate and the third die but not the first die, and (a)(ii) the first die is adjacent the third die but not under the third die, and (b) at least one of a metal stiffener, a heat sink, and a heat tube is on the first die. Memory packages (e.g., a package including die 203) may be bonded to the substrate package using thermal compression bonding and/or epoxy flux to secure the joints of die 203 to die 201. Mass reflow may be used to this end in some embodiments. The large joints between die 203 and substrate 213 are relatively forgiving to tolerances on the die stack side (as opposed to tolerances for interconnects 231). If needed, floating interposers (similar to interposers 107 of FIG. 1) can also be used to couple die 203 to substrate 231.

The steps of process 300 do not need to occur in any specific order. For example, the stiffener/cooling mechanism can be added before, after, or simultaneously with the third die. For example, any or all of the underfill steps may occur before or after the third die is added.

Thus, embodiments described herein offer at least the following advantages over conventional solutions.

First, an embodiment provides a reduced package z height (see height 283 of FIG. 2) of about 0.85 mm as compared to a height of over 1.00 mm for the system of FIG. 1.

Second, an embodiment provides memory package I/O interconnect balls (e.g., some of which may supply power or ground) (see interconnects 231 of FIG. 2) at about a 150 um pitch with about a 40 um chip gap between dies 201, 202. This gives a high density of interconnects (due to relatively small pitch as compared to the pitch of interposer 107 of FIG. 1) which provides increase bandwidth. Further, avoiding routing of signals through the substrate (i.e., using die 201 as a bridge between dies 202, 203) provides a relatively shorter electrical path to the CPU (which helps avoid signal attenuation due to impedance and the like).

Third, an embodiment provides a memory package power, ground, and/or I/O interconnect balls (interconnects 232) at about 0.6 mm pitch with about 140 um memory to substrate gap (distance 284). This provides the size of interconnects most conducive to power/ground/I/O and the like while not hindering bandwidth that can be provided by interconnects 231.

Fourth, an embodiment provides a warpage solution by using a stiffener (e.g., 204 of FIG. 2). In conventional systems using a stiffener may demand the use of a thin die (thinner than ideal for a particular architecture) so that both the stiffener and the die can fit within the confined space below the memory die (see distance 185). However, in embodiments such as system 200 the die thickness for dies 201 and/or 202 is not limited by a gap similar to gap 185. For example, the die thickness (for dies 201, 202, or the cumulative thickness for both dies 201, 202) can go as high as 300 um or more without affecting total stack height (which is more often dictated by the height of elements 203 and/or 213' of the memory stack).

Fifth, in an embodiment the stiffener is exposed to air for external cooling solution access. For example, a heat sink or heat pipe could easily couple to stiffener 204 whereas that would be complicated if not impossible within space 185 for stiffener 104.

Sixth, embodiments provide an architecture that is feasible for client/server architectures. For instance, the die thickness (die 201 and/or die 202) can be increased to become the tallest part of the package for a heat sink if needed. The stiffener can be removed for a high performance package since the substrate is likely be thicker and warpage is likely not as much of an issue for client/server systems (as opposed to mobile computing nodes such as system 900 of FIG. 4).

The decrease in z height may come at a cost of increase in package size in the X-Y plane. For example, in some embodiments the core dies will be in the center of the package or center of the uncore die. Multiple memory packages may be placed around the core dies so that memory can be easily accessed by the core dies. So for the same amount of memory, this architecture may need more surface area for core dies and memory packages. However, since the core die is fairly small (<10 mm^2) in many embodiments the impact of memory package on X-Y dimensions is small.

Various embodiments include a substrate. Such a substrate may be a bulk semiconductive material this is part of a wafer. In an embodiment, the substrate is a bulk semiconductive material as part of a chip that has been singulated from a wafer. In an embodiment, the substrate is a semiconductive material that is formed above an insulator such as a semiconductor on insulator (SOI) substrate.

Figure 4:
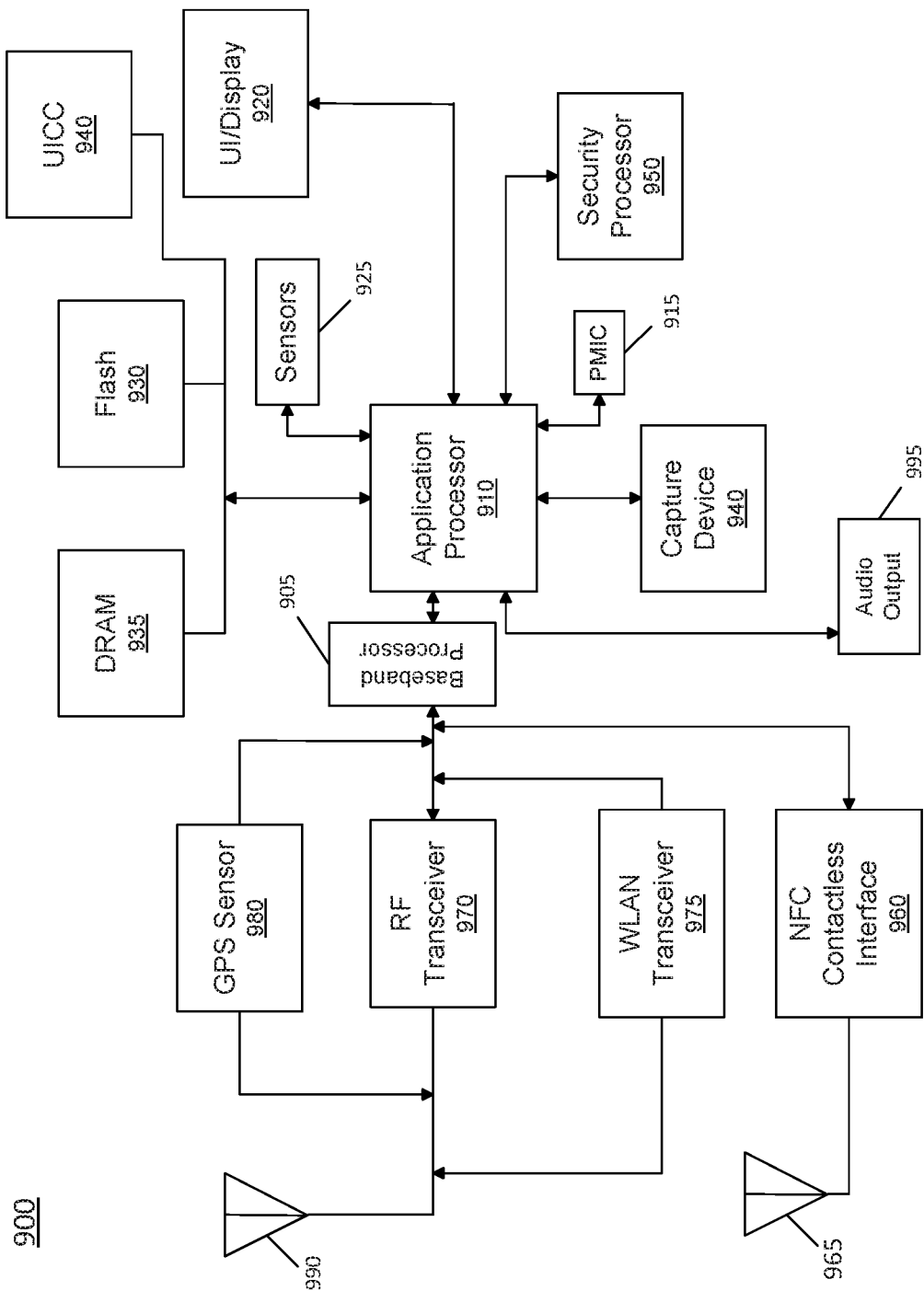
FIGS. 4, 5, and 6 include systems that incorporate embodiments.

Referring now to FIG. 4, shown is a block diagram of an example system with which embodiments can be used. As seen, system 900 may be a smartphone or other wireless communicator or Internet of Things (IoT) device. A baseband processor 905 (which may include the packaging system of embodiments described herein) is configured to perform various signal processing with regard to communication signals to be transmitted from or received by the system. In turn, baseband processor 905 is coupled to an application processor 910 (which may include the packaging system of embodiments described herein), which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 (which may be included in a packaging embodiment described herein) may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) (which may include the thermal management of embodiments described herein) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may include the thermal management of embodiments described herein) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 5:
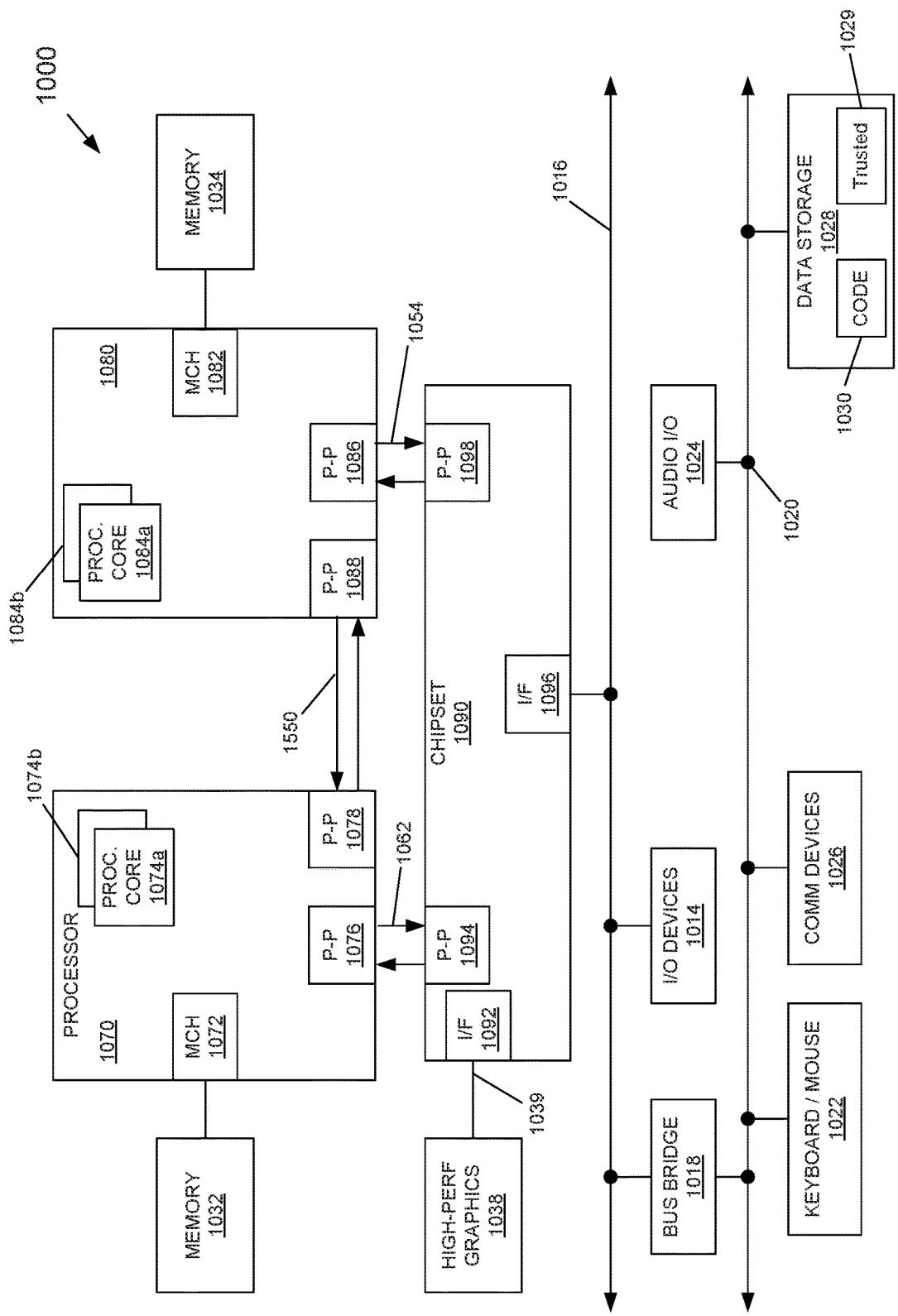

Referring now to FIG. 5, shown is a block diagram of a system in accordance with another embodiment of the present invention. Multiprocessor system 1000 is a point-to-point interconnect system such as a server system, and includes a first processor 1070 (which may include the packaging system of embodiments described herein) and a second processor 1080 (which may include the packaging system of embodiments described herein) coupled via a point-to-point interconnect 1050. Each of processors 1070 and 1080 may be multicore processors such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors (memory and processors may be included in packaging embodiments described herein). First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 (which may include the packaging system of embodiments described herein) includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 6:
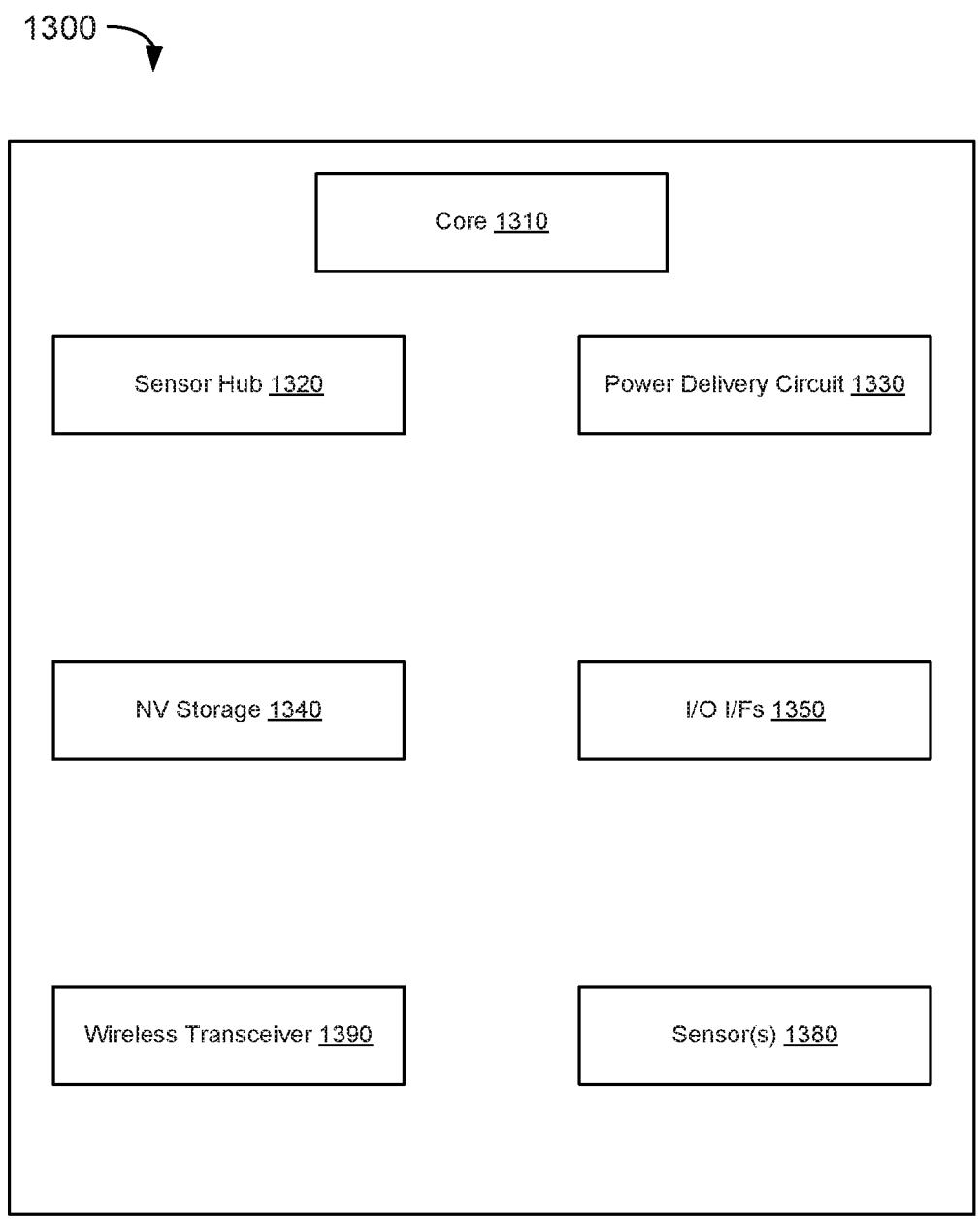

Embodiments may be used in environments where IoT devices may include wearable devices or other small form factor Internet of Things (IoT) devices. Referring now to FIG. 6, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (which may include the packaging system of embodiments described herein). Such core may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340 (which may include the packaging system of embodiments described herein). In an embodiment, this circuit may include a rechargeable battery and a recharging circuit, which may in one embodiment receive charging power wirelessly. One or more input/output (TO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1 includes an apparatus comprising: a substrate; a first die including at least one of an arithmetic logic unit, a floating-point unit, and a cache; a second die including a memory controller; and a third die including memory cells; wherein: (a)(i) the first die has a first minimum pitch and the second die has a second minimum pitch that is greater than the first minimum pitch; (a)(ii) a first vertical axis intersects the substrate and the first and second dies but not the third die; and (a)(iii) a second vertical axis intersects the substrate and the third die but not the first die.

Example 2 includes the apparatus of example 1 wherein the second vertical axis intersects the second die.

Example 3 includes the apparatus of example 2 wherein a third vertical axis intersects the third die but neither of the first and second dies.

Example 4 includes the apparatus of example 1 comprising first and second interconnects, wherein: the first interconnects couple the second die to the third die; the second interconnects couple the third die to the substrate; and the first interconnects include a first minimum interconnect pitch and the second interconnects include a second minimum interconnect pitch that is greater than the first minimum interconnect pitch.

Example 5 includes the apparatus of example 4 wherein the first interconnects include signal interconnects and the second interconnects include power interconnects.

Example 6 includes the apparatus of example 4 comprising: underfill material between the first and second dies; and additional underfill material between the second and third dies.

Example 7 includes the apparatus of example 4 wherein the first and second interconnects each include controlled collapse chip connection (C4) interconnects.

Example 8 includes the apparatus of example 4 comprising an additional substrate located between the third die and the second interconnects.

Example 9 includes the apparatus of example 1 comprising a metal stiffener on the first die, wherein the first vertical axis intersects the metal stiffener.

Example 10 includes the apparatus of example 9 comprising at least one of a heat sink and a heat pipe on the metal stiffener, wherein the at least one of the heat sink and the heat pipe intersects the first vertical axis.

Example 11 includes the apparatus of example 1 comprising at least one of a heat sink and a heat pipe, wherein the at least one of the heat sink and the heat pipe is on the first die and intersects the first vertical axis.

Example 12 includes the apparatus of example 1 wherein the second die is between the first die and the substrate.

Example 13 includes the apparatus of example 12 wherein the second die includes a through silicon via (TSV).

Example 14 includes the apparatus of example 1 wherein the third die extends further above the substrate than the first die.

Example 15 includes the apparatus of example 1 comprising: first package molding that is molded onto and conformal with the first die; and second package molding that is molded onto and conformal with the third die.

Example 16 includes the apparatus of example 15 wherein the first and second package moldings are not monolithic with each other.

Example 17 includes the apparatus of example 1 wherein the first die is adjacent the third die but not under the third die.

Example 18 includes the apparatus of example 17 wherein: the second die couples the first die to the third die; and the first minimum pitch includes a minimum center-to-center distance between immediately adjacent interconnect lines on the first die and the second minimum pitch includes a minimum center-to-center distance between immediately adjacent interconnect lines on the second die.

Example 19 includes a method comprising: providing a first die and a second die, the first die including a processor core and the second die having exposed through silicon vias (TSVs); adhering the first die to the second die to form a processor stack; providing underfill material between the first and second dies; adhering the processor stack to a substrate; providing underfill material between the CPU stack and the substrate; adhering a third die, which includes memory cells, to the substrate; wherein: (a)(i) the second die does not include a processor core, (a)(ii) the first die has a first minimum pitch and the second die has a second minimum pitch that is greater than the first minimum pitch; (a)(ii) a first vertical axis intersects the substrate and the first and second dies but not the third die; and (a)(iii) a second vertical axis intersects the substrate and the third die but not the first die.

Example 20 includes the method of example 19 comprising adhering at least one of a metal stiffener, a heat sink, and a heat tube to the first die, wherein: the first die is between the second die and the at least one of a metal stiffener, a heat sink, and a heat tube to the first die; and the second die is between the first die and the substrate.

Example 21 includes an apparatus comprising: a substrate; a first die including a processor core; a second die not including a processor core; and a third die including memory cells; wherein: (a)(i) the first die has a smaller minimum pitch than the second die; (a)(ii) a first vertical axis intersects the substrate and the first and second dies but not the third die; and (a)(iii) a second vertical axis intersects the substrate and the second and third dies but not the first die.

Example 22 includes the apparatus of example 21 comprising first and second controlled collapse chip connection (C4) interconnects, wherein: the first interconnects couple the second die to the third die; the second interconnects couple the third die to the substrate; and the first interconnects have a smaller minimum interconnect pitch than the second interconnects.

Example 23 includes the apparatus of example 22 comprising at least one of a metal stiffener, a heat sink, and a heat tube on the first die, wherein the first vertical axis intersects the at least one of a metal stiffener, a heat sink, and a heat tube on the first die.

Example 24 includes the apparatus of example 23 wherein the second die is between the first die and the substrate.

Example 25 includes the apparatus of example 23 wherein: the third die extends further above the substrate than the first die; the first die is adjacent to the third die but not under the third die; the second die couples the first die to the third die; and the second die includes vias that extend from a first surface of the second die to a second surface of the second die.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a substrate;
   a first die including at least one of an arithmetic logic unit, a floating-point unit, or a cache;
   a second die including a memory controller; and
   a third die including memory cells;
   wherein: (a)(i) the first die has a first minimum pitch and the second die has a second minimum pitch that is greater than the first minimum pitch; (a)(ii) a first vertical axis intersects the substrate and the first and second dies but not the third die; and (a)(iii) a second vertical axis intersects the substrate and the third die but not the first die.

2. The apparatus of claim 1 wherein the second vertical axis intersects the second die.

3. The apparatus of claim 2 wherein a third vertical axis intersects the third die but neither of the first and second dies.

4. The apparatus of claim 1 comprising first and second interconnects, wherein:
   the first interconnects couple the second die to the third die;
   the second interconnects couple the third die to the substrate; and
   the first interconnects include a first minimum interconnect pitch and the second interconnects include a second minimum interconnect pitch that is greater than the first minimum interconnect pitch.

5. The apparatus of claim 4 wherein the first interconnects include signal interconnects and the second interconnects include power interconnects.

6. The apparatus of claim 4 comprising:
   underfill material between the first and second dies; and
   additional underfill material between the second and third dies.

7. The apparatus of claim 4 wherein the first and second interconnects each include
   controlled collapse chip connection (C4) interconnects.

8. The apparatus of claim 4 comprising an additional substrate located between the third die and the second interconnects.

9. The apparatus of claim 1 comprising a metal stiffener on the first die, wherein the first vertical axis intersects the metal stiffener.

10. The apparatus of claim 9 comprising at least one of a heat sink or a heat pipe on the metal stiffener, wherein the at least one of the heat sink or the heat pipe intersects the first vertical axis.

11. The apparatus of claim 1 comprising at least one of a heat sink or a heat pipe, wherein the at least one of the heat sink or the heat pipe is on the first die and intersects the first vertical axis.

12. The apparatus of claim 1 wherein the second die is between the first die and the substrate.

13. The apparatus of claim 12 wherein the second die includes a through silicon via (TSV).

14. The apparatus of claim 1 wherein the third die extends further above the substrate than the first die.

15. The apparatus of claim 1 comprising:
    first package molding that is molded onto and conformal with the first die; and
    second package molding that is molded onto and conformal with the third die.

16. The apparatus of claim 15 wherein the first and second package moldings are not monolithic with each other.

17. The apparatus of claim 1 wherein the first die is adjacent the third die but not under the third die.

18. The apparatus of claim 17 wherein:
    the second die couples the first die to the third die; and
    the first minimum pitch includes a minimum center-to-center distance between immediately adjacent interconnect lines on the first die and the second minimum pitch includes a minimum center-to-center distance between immediately adjacent interconnect lines on the second die.

19. An apparatus comprising:
    a substrate;
    a first die including a processor core;
    a second die not including a processor core; and
    a third die including memory cells;
    wherein: (a)(i) the first die has a smaller minimum pitch than the second die; (a)(ii) a first vertical axis intersects the substrate and the first and second dies but not the third die; and (a)(iii) a second vertical axis intersects the substrate and the second and third dies but not the first die.

20. The apparatus of claim 19 comprising first and second controlled collapse chip connection (C4) interconnects, wherein:
    the first interconnects couple the second die to the third die;
    the second interconnects couple the third die to the substrate; and
    the first interconnects have a smaller minimum interconnect pitch than the second interconnects.

21. The apparatus of claim 20 comprising at least one of a metal stiffener, a heat sink, or a heat tube on the first die, wherein the first vertical axis intersects the at least one of a metal stiffener, a heat sink, or a heat tube on the first die.

22. The apparatus of claim 21 wherein the second die is between the first die and the substrate.

23. The apparatus of claim 21 wherein:
    the third die extends further above the substrate than the first die;
    the first die is adjacent to the third die but not under the third die;
    the second die couples the first die to the third die; and
    the second die includes vias that extend from a first surface of the second die to a second surface of the second die.

* * * * *